United States Patent [19]
Forrest et al.

[11] Patent Number: 6,005,266
[45] Date of Patent: Dec. 21, 1999

[54] VERY LOW LEAKAGE JFET FOR MONOLITHICALLY INTEGRATED ARRAYS

[75] Inventors: Stephen Ross Forrest, Princeton; Marshall J. Cohen, Robbinsville, both of N.J.; Michael J. Lange, Yardley, Pa.; Dong-Su Kim, Lawrenceville, N.J.

[73] Assignee: The Trustees of Princeton University, Princeton, N.J.

[21] Appl. No.: 08/816,313

[22] Filed: Mar. 13, 1997

[51] Int. Cl.$^6$ .......................... H01L 29/80; H01L 31/112
[52] U.S. Cl. ............................ 257/258; 257/256; 257/458
[58] Field of Search ..................................... 257/256, 258, 257/458

[56] References Cited

U.S. PATENT DOCUMENTS

| | | | |
|---|---|---|---|
| 3,930,300 | 1/1976 | Nicolay | 29/571 |
| 4,990,990 | 2/1991 | Albrecht et al. | 357/30 |
| 5,107,319 | 4/1992 | Lauterbach et al. | 357/30 |
| 5,386,128 | 1/1995 | Fossum et al. | 257/183.1 |

FOREIGN PATENT DOCUMENTS 59-184571  10/1984  Japan .

OTHER PUBLICATIONS

D.C. W. Lo and S. R. Forrest, Senior Members, IEEE, "Performance of $In_{0.53}Ga_{0.47}As$ and InP Junction Field–Effect Transistors for Optoelectronic Integrated Circuits. I. Device Analysis", *Journal of Lightwave Technology*, vol. 7, No. 6, pp. 957–965, Jun. 1989.

L. J. Kozlowski, J. M. Arias, G. M. Williams, K. Vural, D. E. Cooper and S. A. Cabelli, "Recent Advances in Staring Hybrid Focal Plane Arrays: Comparison of HgCdTe, InGaAs, and GaAs/AlGaAs Detector Technologies", *SPIE*, vol. 2274, 1993.

J. G. Bauer, H. Albrecht, L. Hoffmann, D. Römer, and J. W. Walter, "Locally Ion–Implanted JFET in an InGaAs/InP p–i–n Photodiode Layer Structure for a Monolithically Planar Integrated Receiver OEIC", *IEEE Photonics Technology Letters*, vol. 4, No. 3, pp. 253–255, Mar. 1992.

Hiroshi Yano, Sosaku Sawada, Takashi Kato, Goro Sasaki, Kentaro Doguchi, and Michio Murata, "Monolithic Integration of pin/HBT Optical Receiver with HBT Comparator on InP Substrate", in *Proc. IEEE LEOS Annu. Meet*, vol. 1, pp. 19–20, 1995.

Julian Cheng, S. R. Forrest, R. Stall, G. Guth, and R. Wunder, "Depletion and enhancement mod $In_{0.53}Ga_{0.47}As$/ InP junction field–effect transistor with a p $^+$–InGaAs confinement layer", *Appl. Phys. Lett 46(9)*, pp. 885–887, May 1, 1985.

D. C. W. Lo, Y. K. Chung, and S. R. Forrest, "A Monolithically integrated $In_{0.53}Ga_{0.47}As$ Optical Receiver with Voltage–Turnable Transimpedance", *IEEE Photonic Technology Letters*, vol. 3, pp. 757–760, Aug. 1991.

G. Olsen, A. Joshi, M. Lange, K. Woodruff, E. Mykietyn, D. Gay, G. Erickson, D. Ackley, and V. Ban, "A 128×128 InGaAs Detector Array for 1.0–1.7 Microns", *Proc. SPIE*, vol. 1341, pp. 432–437, 1990.

Gregory H. Olsen, "InGaAs fills the near–IR detector–array vacuum", *Laser Focus World*, vol. 27, pp. A21–A30, 1991.

Dong–Su Kim, Stephen R. Forrest, Fellow, IEEE, Michael J. Lange, Gregory H. Olsen, Fellow, IEEE, and Walter Kosonocky, Fellow, IEEE, "A Monolithically Integrated InGaAs–InP p–i–n/JFET Focal Plane Array", *IEEE Photonics Technology Letters*, vol. 8, No. 4, Apr. 1996.

*Primary Examiner*—Mahshid Saadat
*Assistant Examiner*—George C. Eckert, II
*Attorney, Agent, or Firm*—Watov & Kipnes, P.C.

[57] ABSTRACT

A low leakage current monolithic InGaAs InP discrete device is provided for a focal plane array for near-infrared imaging. The array consists of a plurality of InGaAs p-i-n diodes for photodetectors, with each being integrated on a common substrate with an Inp junction field effect transistor (JFET) as a switching element for each pixel. In order to minimize the drain and gate leakage to achieve high-detection sensitivity, a p-encapsulation of an n-drained of each JFET is employed.

6 Claims, 4 Drawing Sheets

6,005,266

VERY LOW LEAKAGE JFET FOR MONOLITHICALLY INTEGRATED ARRAYS

GOVERNMENT RIGHTS

This invention was made with Government support under Contract No. N00014-93-1-0223-A0001, awarded by NASA/JPL Small Business Innovative research and the Office of Naval Research. The Government has certain rights in this invention.

FIELD OF THE INVENTION

The present invention relates generally to the fabrication of junction field effect transistors (JFETs), both as discrete devices and as monolithically integrated into focal plane arrays for near-infrared image detection, for example.

BACKGROUND OF THE INVENTION

Near-Infrared focal plane arrays (FPA's) are of considerable interest for numerous applications including astronomical imaging, spectroscopy, thermal imaging, night vision, eye-safe surveillance, food processing, etc. Of the many materials used for imaging systems that operate in the near infrared (e.g., HgCdTe, Ge, InSb, PtSi, etc.), InGaAs p-i-n detectors are most attractive for wavelengths between $\lambda=1$ and 1.7 $\mu$m due to their high performance and reliability [G. H. Olsen, "InGaAs fills the near-IR detector array vacuum," *Laser Focus World*, Vol. 27, pp. A21–A30, 1991]. The advantages of InGaAs p-i-n detectors include low dark current, high quantum efficiency, subnanosecond response, and room temperature operation. To date, 256×256 arrays of these detectors have been demonstrated for imaging purposes [G. Olsen, et al., "A 128×128 InGaAs detector array for 1.0–1.7 microns," in *Proc. SPIE*, Vol. 1341, 1990, pp. 432–437].

Most infrared imaging arrays demonstrated to date are hybrid devices, where the photodetectors are interconnected to silicon CMOS or CCD multiplexer readout arrays by either flip-chip or wire bonding. This not only degrades the performance of the arrays by introducing parasitics, but also significantly increases cost since multiple IC's are required, engendering complex manufacturing steps, and lowering yield due to the additional handling. Therefore, fully monolithic focal plane arrays which have the potential for reducing cost while increasing performance, are desirable.

Note that very low leakage current JFET arrays may also be used to fabricate liquid crystal backplanes for liquid crystal displays with extra-low power demand to hold the image between refresh cycles, which is particularly important in portable, battery operated equipment such as laptop computers.

SUMMARY OF THE INVENTION

An object of the invention is to provide a JFET with very low leakage current.

It is yet another object of the invention to provide a monolithically integrated array of JFETs, that may be used as the focal plane of a near-infrared imager, with sensitivity high enough so as not to require cryogenic cooling.

With these and other objects in mind, the present invention provides novel InP junction field effect transistors (JFETs) with very low leakage which are suitable for monolithic integration with infrared focal plane arrays. This device consists of an InP n-channel completely surrounded (or "encapsulated") by a p region formed by a p+ layer under the channel and diff-used area surrounding the device perimeter. In this geometry, the depletion region pinches off the channel from both top and bottom, thereby decreasing the switching voltage by a factor of two as compared with a conventional JFET with a single gate p-n junction [J. Cheng, et al., "Depletion and Enhancement Mode $In_{0.53}Ga_{0.47}As$/InP Junction Field-Effect Transistor with a p+-InGaAs Confinement Layer," *Appl. Phys. Lett.*, Vol. 46, pp. 885–887 (1985)]. Also, there are no exposed p-n junctions, thus eliminating any surface leakage from the side walls of the JFET mesa. This structure also leads to improved yield since it eliminates any possibility of gate interconnect metallization shorting the device at the side walls. These features, coupled with the fact that lightly-doped InP was chosen as the channel material, resulted in discrete JFETs with drain-source leakage currents as low as 2 pA, which is believed to be a ten thousand-fold improvement over previous, conventional InP/InGaAs JFET leakage currents [see above and J. G. Bauer, et al., "Locally Ion-Implanted JFET in an InGaAs/InP p-i-n Photodiode Layer Structure for a Monolithically Planar Integrated Receiver OEIC," *IEEE Photon. Technol. Lett.*, Vol. 4, pp. 253–255, (1992)]. This "p-encapsulation" concept can be applied to any other material system where very low leakage JFETs are needed.

Note that InP, as presented herein in conjunction with the present method and apparatus, is not meant to be limiting, and is given herein for purposes of illustration. As indicated, the invention is applicable to other material systems, such as GaAs, InSb and the like as well as to the construction techniques for JFETs generally.

BRIEF DESCRIPTION OF THE DRAWINGS

Various embodiments of the present invention are described and illustrated with reference to the accompanying drawings, in which like items are indicated by the same reference designation, wherein.

DETAILED DESCRIPTION OF THE INVENTION

One embodiment of the invention provides fully monolithic near-infrared 4×4, 8×8, and 16×16 focal plane arrays (FPA's), in which each InGaAs photodiode can be individually addressed by biasing the gates of novel, very low leakage (~2 pA) InP JFET switching elements at each pixel site. The present junction field effect transistors (JFET's) have been shown to be well-suited for integration with the InGaAs p-i-n detectors as well as having demonstrated both low gate leakage and high stability.

Figure 1:
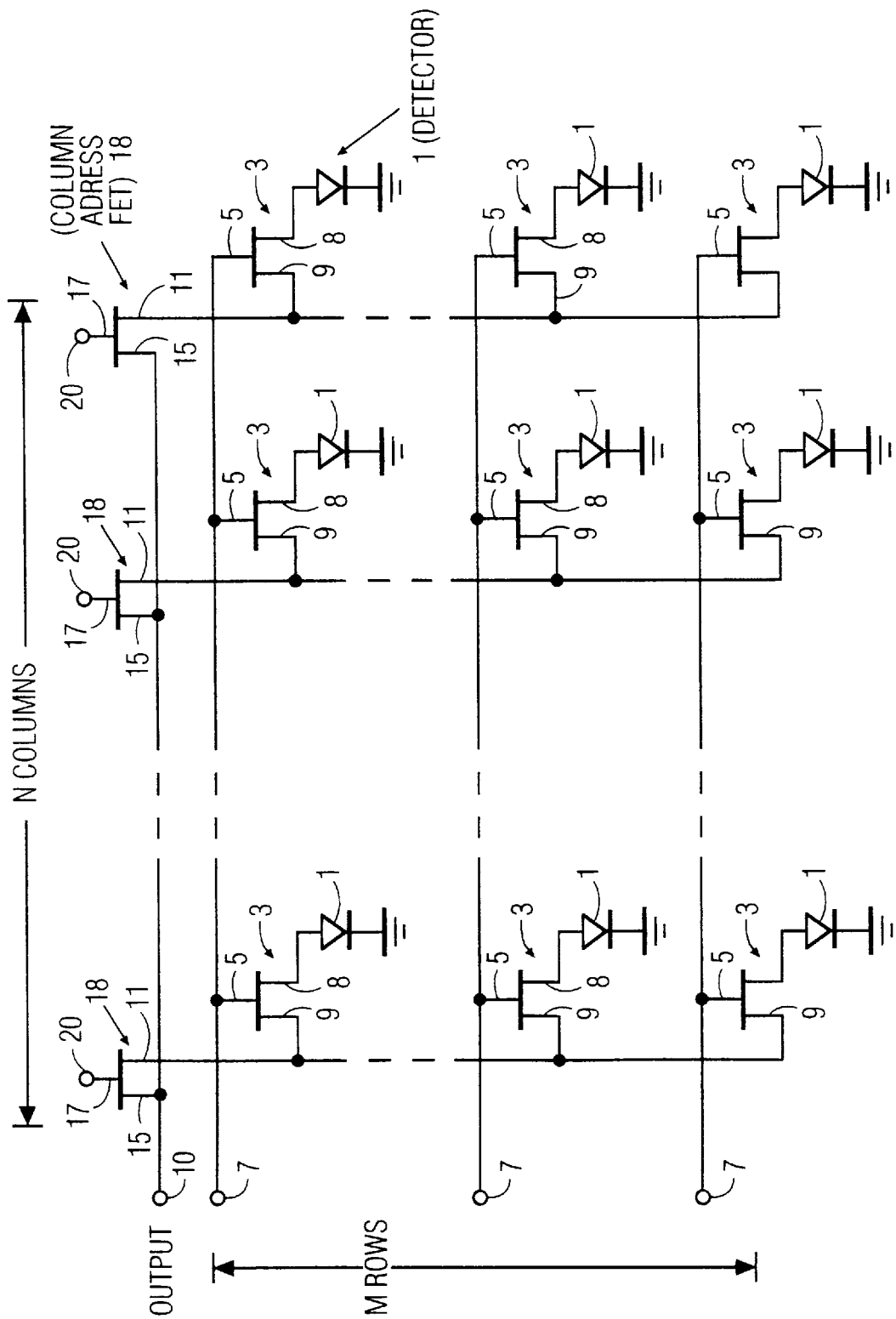
FIG. 1 shows a schematic circuit diagram of a focal plane array for one embodiment of the invention.

A schematic circuit diagram of an FPA for one embodiment of the invention is shown in FIG. 1. Each photodiode 1 is connected to the drain 8 of a JFET 3 at each pixel, where the gates 5 in each row are connected in parallel and addressed by a single contact pad 7 at the edge of the array. The JFET sources 9 in a column are tied to the drains 11 of column address JFETs 18, respectively. The gate electrodes 17 of each column JFET 18 are connected to an individual contact 20 for receiving an individual column select signal, respectively. The sources 15 of these "column JFET's" 18 are also connected in parallel and in common to an output pad 10. Thus by biasing the gates 5 of a given row of JFET's 3 and gate 17 of the appropriate "column address JFET 18," one can address the light detector or photodiode 1 in the chosen pixel. By scanning the M (M=1,2,3,4 ...) rows and the N (N=1,2,3,4 ...) columns of the two dimensional (2-D) array, via the appropriate application of operating signals to contact pads 7 and 20, the incident light can be imaged without a need for a separate, externally bonded multiplexer.

It is important that the gate and channel leakage currents of the JFETs 3, 18 be minimized since the leakage currents from an entire column is summed at the output 9, thereby limiting the ultimate array dimensions and sensitivity. For this purpose, one embodiment of the invention provides a JFET design including an InP n-channel 15 completely surrounded (or "encapsulated") by a p region formed by a p+ layer 23 both under the channel 15 and surrounding the device perimeter [See FIGS. 2 and 3]. In this geometry, the depletion region pinches off the channel from both top and bottom, thereby decreasing the switching voltage by a factor of two as compared with a conventional JFET with a single gate p-n junction. Also, there are no exposed side walls of the JFET mesa.

Encapsulation of the sides of the p-n channel with a p+ region is a crucial and new development, as confinement or isolation layers have been added in the past [J. Cheng, S. R. Forrest, R. Stall, G. Guth, and R Wunder, "Depletion and enhancement mode $In_{0.53}Ga_{0.47}As$/InP junction field-effect transistor with a p+-InGaAs confinement layer," *Applied Physics. Letter,* Vol. 46, pp. 885–887, 1985]. A surrounding X-Y perimeter for the JFET mesa to accomplish total encapsulation has not been incorporated. The p+ encapsulation 23 is accomplished by diffusion from the top device surface 22 to at least the depth of the bottom p-layer 12.

This structure also leads to improved yield since it eliminates any possibility of gate interconnect metallization shorting the device at the side walls. These features, coupled with the fact that lightly-doped InP was chosen as the channel material, provide discrete JFET's 3, 18 with drain leakage currents as low as 2 pA at room temperature, which is believed to be a ten thousand-fold improvement over previous, conventional InP-InGaAs JFET leakage currents.

As a preface to the discussion of examples given below, note that the most complex structure, that of an FPA is discussed. An FPA pixel comprises a detector photodiode 1, which is substantially the left half of FIG. 2, and a JFET 3, which comprises substantially the right half of FIG. 2. A JFET array suitable as a backplane for a liquid crystal display would be as described for an FPA, but without the photodiodes 1. A discrete JFET would be a pixel structure without a photodiode.

For clarity in following the process, indicies are provided for the photodiode 1 as well.

Figure 2:
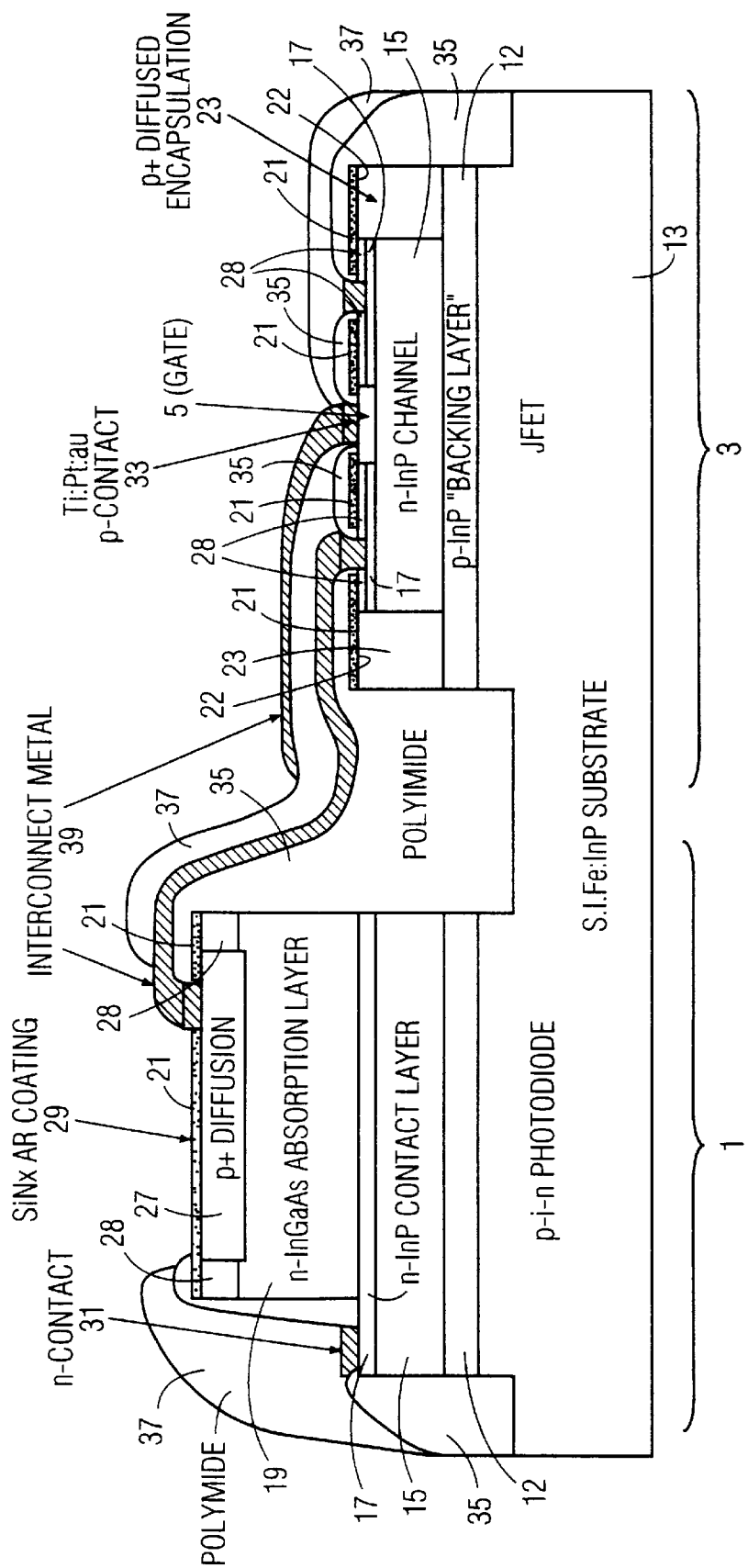
FIG. 2 shows a cross-sectional diagram of an array pixel, the right hand portion of which is substantially identical to the construction of a discrete JFET for one embodiment of the invention.

In FIG. 2, the epitaxial structure of an example of an FPA for the embodiment of the invention is as follows: First, a $1\times10^{18}cm^{-3}$ Be-doped, 3000-Å-thick p-InP JFET "backing layer" 12 is grown onto the surface of a (100) Fe: InP semi-insulating substrate 13 using gas source molecular beam epitaxy or metalorganic chemical vapor phase deposition. Next, a $5\times10^{16}cm^{-3}$, 1 μm thick Si-doped n-InP channel 15, a $1\times10^{17}cm^{-3}$ 1000-Å-thick Si-doped n-InP contact layer 17, an undoped ($n<10^{16}cm^{-3}$), 1.5-μm-thick InGaAs detector absorption layer 19, and $2\times10^{16}cm^{-3}$~300 Å-thick Si-doped n-InP cap layers 28 over layers 19 and portions of layers 17 over channel layers 15 are grown in succession, followed by passivating the cap layers 28 using plasma enhanced deposition of a 1000 Å thick SiNx layer; in this example. Note that as indicated, channel doping may range between $5\times16^{16}cm^{-3}$ to $1\times10^{17}cm^{-3}$.

Figure 3:
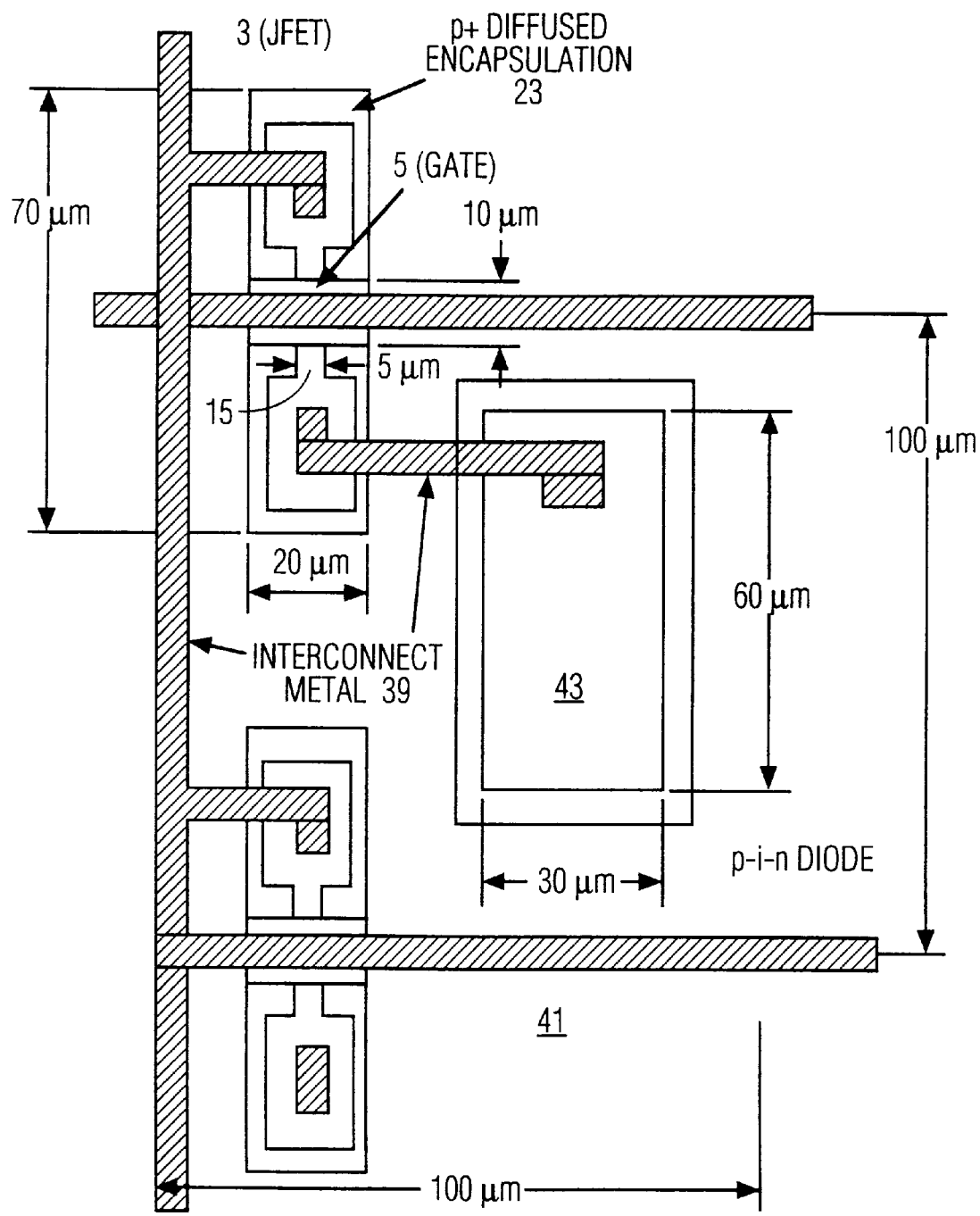
FIG. 3 shows the top view of a single-pixel element for one embodiment of the invention.

The fabrication of FPA's generally starts with the etching of the p-i-n and then JFET "isolation" mesas using either $CH_4:H_2$ (6:30 sccm) reactive ion etching (100 mTorr, 180 W), or $HBr:H_2O_2$ (10:1) diluted in DI water (10:1) wet etching solution for InP layers, and citric acid (50%):$H_2O_2$ (5:1) for etching the InGaAs layers. This latter etchant is very selective and stops abruptly at the InGaAs-InP material junction, thereby controlling the etch uniformity around the wafer. A 1000-Å thick $SiN_{x\ film}$ 21 deposited by plasma enhanced Chemical Vapor Deposition (CVD) was used as an etch mask. Sealed ampuole diffusion at 500° C using $Zn_2As_3$ as the source creates the p+ isolation region 23 around the perimeter of the JFET's 3. A second diffusion, 3000Å deep, simultaneously defines the JFET gates 5 and the p region 27 of the p-i-n photodiode 1. The active area of the p-i-n photodiode 1 is coated by a 1800-Å-thick SiNx AR coating 29. Electron beam deposited Ge:Au:Ni:Au (270:450:215:450Å thick) and Ti:Pt:Au (200:300: 1000Å) thin films were used for n and p contacts, 31, 33, respectively. The n contact 31 is alloyed at 365° C. for 90 seconds in a rapid thermal annealer. A 5000-Å-thick spin-on polyimide layer 35, fully cured at 300° C. for 30 minutes, provides passivation and planarization of the devices, and a second polyimide layer 37 provides isolation between the Ti:Au (200:5000 Å) interconnect metal line and metallization cross-overs 39. As shown in the example of FIG. 3, each pixel of the array occupies a 100 μm×100 μm area 41, with the p-i-n photodiode I having a 30 μm ×60 μm active detection area 43 (corresponding to an 18% optical fill factor). The JFET channel 15 is 5μm wide, with a 10 μm long gate 5 geometry chosen to provide the highest off-resistance along with a large on/off ratio. The total JFET 3 dimension is 70×20 μm. Dimensions of 4×4, 8×8, and 16×16 FPA arrays of the invention were prototyped in 0.35 $mm^2$, 1.0 $mm^2$, and 3.2 $mm^2$ areas, respectively.

In an alternative embodiment of the invention, all $p^+$ diffusions are replaced by ion implantation of the appropriate p-type atomic species, i.e. Be. Conversely, the entire channel 15 can be grown or doped p-type, and the n-type regions can be formed by ion-implantation of the appropriate n-type atomic species, i.e., Si.

Note that the column address JFETs 18 are preferably fabricated as described for JFETs 3 on a common substrate 13. Metallization or electrical connections between JFET's 3 and 18, and output pad 10 and the source electrodes 8 of the column address JFETs 18 are made in a conventional manner. Also, the thickness of various layers described in this description of embodiments of the invention are optimized for enhancing the performance of the present JFET, but other applications may require different thicknesses.

From the above discussion, it will be obvious to one skilled in the art that there are many possible substitutions for the materials and process that can be expected to work equally well. For instance, InP is a III–IV semiconductor and the techniques employed here are equally applicable to other III–V semiconductors such as GaAs. Similarly, silicon dioxide can substitute for silicon nitride as both an anti-reflection coating and as passivation for the same III–V material systems. Along the same lines, there are alternative dopants as well as other common metallization schemes and polymer coatings other than polyimide. For example, dopants such as S (Sulphur) for n-type, and Zn (Zinc) or Cd (Cadmium) for p-type, can be used. Also, any contact metal known for making an Ohmic contact is acceptable. Both chemical and reactive ion processes have been described as etching techniques, and ion-implantation could be used instead of thermal diffusion for doping, and sputtering, thermal deposition or electroplating can be used to deposit the contact metallization instead of electron beam deposition. Also, doping levels and layer thicknesses may be varied according to the needs of a specific application.

Figure 4:
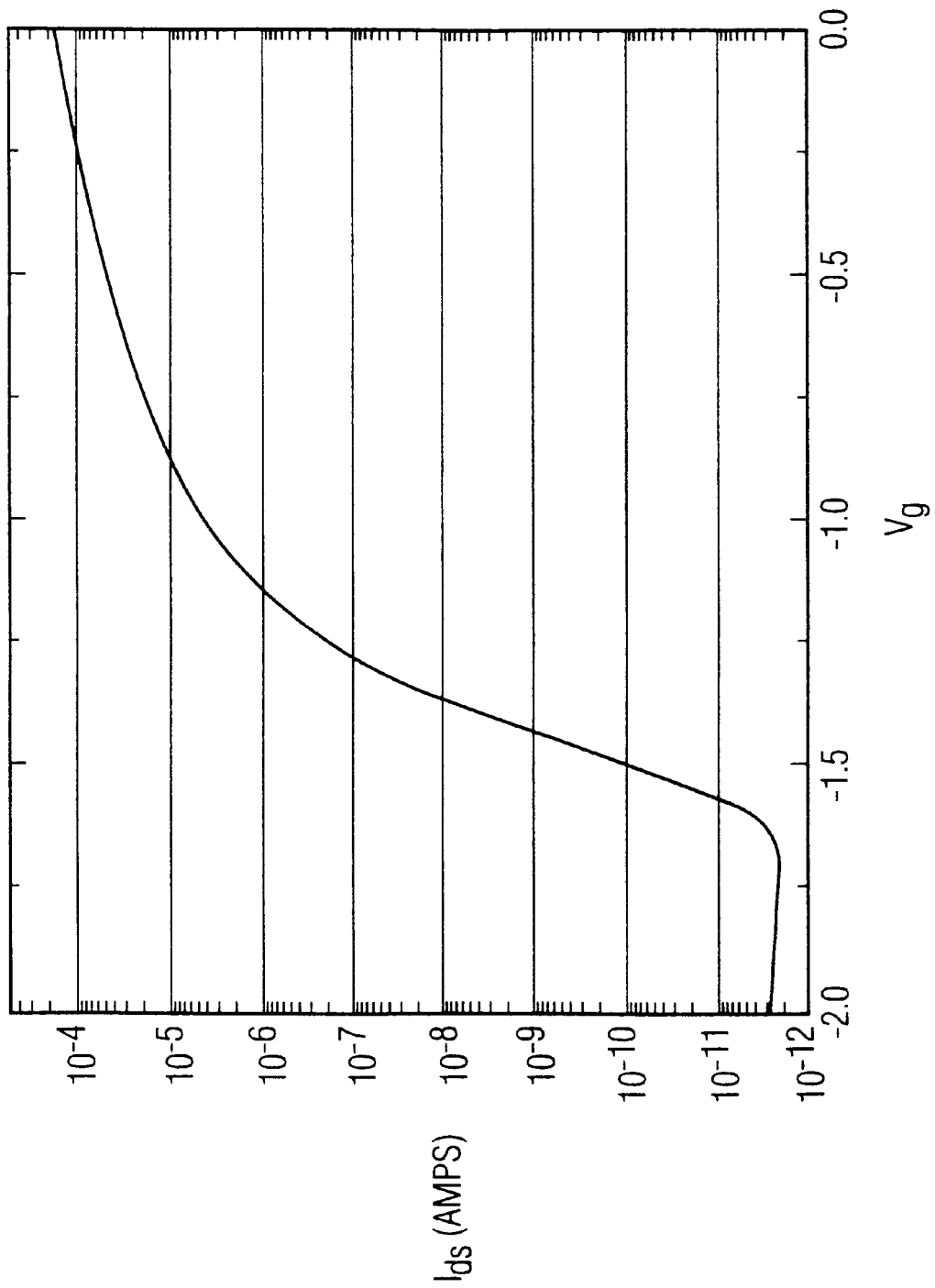
FIG. 4 shows drain current ($I_{ds}$) versus gate voltage ($V_g$) of an integrated JFET. The drain-source voltage ($V_{ds}$) is 1 V, with the drain grounded.

The drain current ($I_{ds}$) versus gate voltage ($V_g$) at a drain-source voltage of 1 V for an integrated JFET 3 of the invention is shown in FIG. 4. By changing the gate voltage by less than 2 V, the drain current is decreased by six decades, reaching a minimum leakage current $I_{ds}$ of less than 2 pA at −1.6 V. The lower limit to $I_{ds}$ is set by the gate leakage current, and thus biasing the gate even further slightly increases the leakage. The typical dark current of the p-i-n diodes 1 of the prototype was 2 nA at IV reverse bias, with external quantum efficiencies of $\eta=(0.7\pm0.05)$ at $\lambda=1.3$ $\mu$m.

To address the array pixels, a scanning circuit constructed by the inventors operated at several clock rates between 125 kHz and 1 MHz, corresponding to single frame acquisition times between 3.2–0.4 ms, for arrays as large as a 20×20. The prototype FPA's were tested at the wafer level using a probe card connected to a scanning unit, and the output was monitored on an oscilloscope. The gate voltage was switched between O and −2V to achieve the on and off states, respectively, and the output and common electrodes were biased at 5V and 6V, respectively. Referring to FIG. 3, this 2V swing is adequate to achieve full switching of the JFETs at each pixel. All the measurements were performed at room temperature.

A two-dimensional readout of the output of a 8×8 prototype array illuminated at $\lambda=1.3$ $\mu$m from a 100 $\mu$W output laser diode incident via a 8 $\mu$m diameter single-mode fiber showed a peak photocurrent of 8.2 $\mu$A, and an average leakage for the entire row of detectors and JFETs 3 of 1.5 $\mu$A. The frame was scanned at 125 kHz. At higher scan rates, the output signal decreased due to the large parasitic capacitance and inductance of the probe card, although the single pixel bandwidth was >100 MHZ when measured using high frequency response coaxial wafer probes. This bandwidth is adequate for 512×512 arrays, where each pixel must be operated at 8 MHZ to achieve the required 30 Hz frame rate.

A two-dimensional readout of the output of a prototype 16×16 array was measured under identical test conditions as described above. The peak current from the illuminated pixel was 5.9 $\mu$A, and the average leakage per row was 1 $\mu$A. The calculated noise equivalent power (NEP) for this array is $10^{-12}$W/cm$_2$ Hz$^{1/2}$, corresponding to a detectivity of $D^*=5\times10^{-14}$ cm (HZ)$^4$/W, using 100 MHZ as the bandwidth and $4.6\times10^{-3}$cm$^2$ as the total detection area. This value of $D^*$ is comparable to hybrid InGaAs FPA's, and at least two orders of magnitude higher than the HgCdTe FPA's at room temperature [L. J. Kozlowski, J. M. Arias, G. M. Williams, K Vural, D. E Cooper, S. A. Cabelli, and C. Bruce, "Recent advances in staring hybrid focal plane arrays: Comparison of HgCdTe, InGaAs, and GaAs/AlGaAs detector technologies," in *Proc. SPIE*, Vol. 2274, 1994, pp. 93–116]. Over 93% of the 16×16 array was functional, with >99% device yield (out of 528 active components). One Hundred percent (100%) of the 8×8 array was functional, with 100% individual device yield.

In summary, the present invention provides a novel JFET for minimizing the drain off-state leakage current to <2 pA.

In one application of the present invention, for providing near-infrared focal plane arrays including InGaAs p-i-n photodiodes monolithically integrated with the present InP JFET's 3, 18 prototype arrays as large as 16×16 were produced by the inventors with >93% pixel and 99% device yield. A typical phototype 16×16 array consists of 256 detectors 1 and 272 JFETs 3, 18 making this circuit at least five times larger than any previously reported optoelectronic integrated circuit in the InP-based materials system known by the inventors [for example, see H. Yano, S. Sawada, T. Kato, G. Sasaki, K. Doguehi, and M. Murata, "Monolithic integration of pin/HBT optical receiver with HBT comparator on InP substrate," in *Proc. IEEE LEOS Annu. Meet.*, Vol. 1, 1995. Pp. 19–20]. This work shows great promise for achieving even larger scale integrated imaging arrays.

Although various embodiments of the invention are shown and described herein they are not meant to be limiting. For example, those of skill in the art may recognize certain modifications to these embodiments, which modifications are meant to be covered by the spirit and scope of the appended claims.

What is claimed is:

1. A junction field effect transistor including an n-channel having all side and bottom portions encapsulated by p+ material immediately above a lightly-doped InP substrate for providing leakage current less than or equal to 10 picoamps.

2. A monolithically integrated focal plane array (FPA) comprising:

a plurality of photodetectors each having an anode electrode and a cathode electrode, said cathode electrodes of each of said detectors being adapted for connection to a source of reference potential;

a plurality of first electrical contact pads for receiving individual row select signals, respectively;

a plurality of first junction-field-effect switching transistors (JFETS) arranged in N-columns (N=1,2,3 . . . ) and M-rows (M=1,2,3 . . . ) each JFET including a gate electrode, a source electrode, and a drain electrode, respectively, the drain electrodes of each said JFET being connected to the anode electrode of an individual one of said plurality of photodiodes, the source electrodes of each individual column of said plurality of first JFETs being connected in common, the gate electrodes of each individual row of said first JFETs being connected in common to an individual one of said plurality of first electrical contact pads for receiving a row select electrical signal to bias for turn on the said first JFETs in the associated row;

a second electrical contact pad serving as an output terminal;

a plurality of third electrical contact pads for receiving individual column select signals, respectively;

a plurality of second junction-field-effect transistors (JFETS) equal in number and each associated with a particular one of said N-columns of said first plurality of JFETS, each one of said plurality of second JFETS including a gate electrode, source electrode, and drain electrode, the source electrodes of said second JFETs being connected in common to said second electrical contact pad, the drain electrodes of said second JFETs being individually connected to the commonly connected source electrodes of the associated column of said N columns of said first JFETs, respectively, and the gate electrodes of each one of said second JFETs being individually connected to an associated one of said plurality of third electrical contact pads; and each one of said plurality of first JFETs each including an N-channel having all side and bottom portions encapsulated by p+ material immediately above a lightly-doped substrate, for providing low leakage current less than or equal to 10 picoamps.

3. The monolithically integrated focal plane array of claim 2, wherein each one of said plurality of second JFETs each further include an N-channel having all side and bottom portions encapsulated by p+ material immediately above a substrate for providing low leakage current.

4. The monolithically integrated FPA of claim 2, wherein said plurality of photodetectors each consisting of an InGaAs pin detector including means for detecting light in the rear-infrared.

5. A monolithically integrated focal plane array of a plurality of junction field effect transistors each for addressing an associated individual one of a plurality of p-i-n photodiodes, respectively, based on InP, capable of imaging in the near infrared at room temperature and having no less than 256 pixels each formed by junction field effect (JFET) and p-i-n photodiode pairs, respectively, with each JFET including a channel of one conductivity having all side and bottom portions encapsulated by material of opposite conductivity immediately above a lightly-doped substrate for providing low leakage current less than or equal to 10 picoamps.

6. A monolithically integrated focal plane array of a plurality of junction field effect transistors each electrically connected to individual pin photodiodes, capable of imaging in the near infrared at room temperature and having a detectivity no less than $D^*=5\times10^{14}$ cm (Hz)/W.

* * * * *